United States Patent [19]
Han et al.

[11] Patent Number: 5,804,837
[45] Date of Patent: Sep. 8, 1998

[54] POLYSILICON THIN-FILM TRANSISTOR AND METHOD FOR FABRICATING THE SAME

[75] Inventors: Min-Koo Han; Byung-Hyuk Min, both of Seoul; Cheol-Min Park, Kyungki-do, all of Rep. of Korea

[73] Assignee: Samsung Electronics Co., Ltd., Kyungki-do, Rep. of Korea

[21] Appl. No.: 687,630

[22] Filed: Jul. 26, 1996

Related U.S. Application Data

[63] Continuation-in-part of Ser. No. 266,420, Jun. 27, 1994.
[51] Int. Cl.$^6$ .......................... H01L 29/76; H01L 31/036; H01L 31/112
[52] U.S. Cl. .............................................. 257/66; 257/327
[58] Field of Search .............................. 257/66, 327, 338, 257/331

[56] References Cited

U.S. PATENT DOCUMENTS 5,124,769   6/1992   Tanaka et al. ............................. 257/66
5,554,552   9/1996   Chi ............................................ 437/43

FOREIGN PATENT DOCUMENTS 2-27772   1/1990   Japan ........................................ 257/66

OTHER PUBLICATIONS

Min et al., "Polysilicon Thin Film Transistors with PN Junction Gate", International Conference on Solid State Devices and Materials (SSDM '95), pp. 52–54, Aug. 1995.

*Primary Examiner*—Wael Fahmy
*Assistant Examiner*—Howard Weiss
*Attorney, Agent, or Firm*—Cushman Darby & Cushman IP Group of Pillsbury Madison & Sutro LLP

[57] ABSTRACT

To accomplish the objects of the present invention, among others, the present invention provides a thin-film transistor that has a channel region operatively having an offset region only during turn-off. Source and drain regions self-aligned with different ends of the channel region. A gate region is formed on a gate insulating layer disposed over the channel region and has a main gate accepting a gate voltage, a subgate which comes into ohmic contact with the source region, and a junction gate for forming a rectifying junction between the main gate and subgate.

31 Claims, 8 Drawing Sheets

POLYSILICON THIN-FILM TRANSISTOR AND METHOD FOR FABRICATING THE SAME

The present application for a polysilicon thin-film transistor and its fabrication, is based on Korean Application No. 3922/1996 which is incorporated herein by reference for all purposes and is a continuation-in-part of application Ser. No. 08/266,420 filed Jun. 27, 1994 which is also incorporated herein by reference for all purposes.

BACKGROUND OF THE INVENTION

1. Field of the Invention

The present invention relates to a transistor, and more particularly, to a polysilicon thin-film transistor (TFT) and a method of fabricating the same.

2. Description of the Related Art

With the advent of a new generation of communications, development has focused on high-definition systems (HDS), development of which include fields such as capture, processing, transmission, receiving and reflection of information. High technology using HDSs can be utilized for example, in manufacturing and developing new high-priced hightech products in aerospace and the military industry, as well as education and medicine.

Development of displays forms one of central points of HDSs. Portable computers, workstations, and high-definition televisions (HDTV) all require such displays, which, ever more frequently rely on thin-film transistor-liquid crystal displays (TFT-LCD).

TFT-LCD technology using an amorphous silicon TFT has already developed and used in mass production. This technology has been specifically applied to flat-panel displays for portable computers such as lap-top and note-book computers, and accumulated for potential use in HDTV displays.

Interest in polysilicon TFTs has of increased because polysilicon TFTs contain several superior performance characteristics to amorphous silicon TFTs. In particular, high-speed operation and fabrication in CMOS potentially enables polysilicon TFTs to be fabricated with an integrated driving circuit which could reduce manufacturing steps of the display panel, while increasing the yield and reducing the cost of system fabrication. In addition, the abundant amount of current provided due to the high-speed mobility of polysilicon TFTs can potentially provides a grey-scale full color image, enhancing the quality of image displayed.

However, despite of having several excellent performance characteristics, as compared with the amorphous silicon TFT, the polysilicon TFT has been slowly developed because it requires immense manufacturing equipment. However, due to the advantages of the polysilicon TFT, study on its structure and investment in manufacturing equipment for the polysilicon TFT has increased gradually.

Since the polysilicon TFT has mobility and ON currents larger than the amorphous silicon TFT, operation problems arise due to the gate insulating layer being much thinner than that of a general MOS transistor structure. One of the problems is that leakage current is large between the source and drain regions in the OFF state.

Figure 1:
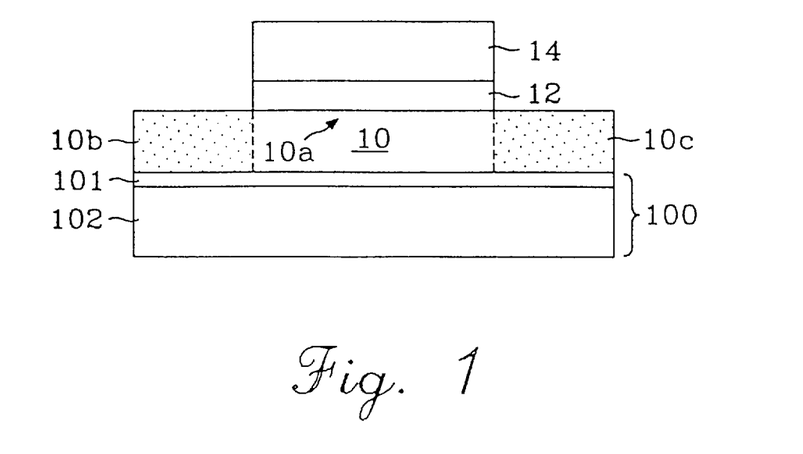
FIG. 1 is a cross-sectional view of a TFT having a conventional non-offset gated structure.

FIG. 1 illustrates a cross-sectional view of a TFT having a conventional non-offset gate structure, in which the source/drain regions are self-aligned with the gate region so that the channel region and source/drain regions are adjacent. An active layer 10 of polysilicon or amorphous silicon is placed above a substrate 100. Above active layer 10 are sequentially formed a gate insulating layer 12 and gate region 14. Substrate 100 is made up of a wafer layer 102 of glass or quartz and a thermal oxide layer 101 thermally grown on wafer layer 102. A region 10a of active layer 10, placed under gate region 14 is used as a channel region when the transistor is turned ON. Its left and right regions are used as the source region 10b and the drain region 10c, respectively. The position of source region 10b and the drain region 10c is automatically self-aligned since gate region 14 is used as a mask during ion implantation that creates the source region 10b and the drain region 10c. Gate region 14, source region 10b, and drain region 10c are respectively connected to the gate electrode, source electrode, and drain electrode. Source region 10b and drain region 10c are designated only for convenience. For example, it should be understood that source region 10b of an N-type transistor serves as drain region 10c of a P-type transistor.

During operation of the FIG. 1, self-aligned structure, that is, non-offset gated structure, the gate electrode and source electrode receive a predetermined voltage. When the source voltage is smaller than the gate voltage during an ON state, the leakage current losses are small, but when the source voltage is larger than the gate voltage during an OFF state, the leakage current losses become large. This is because the predetermined voltage applied to the source region 10b being larger than the turn-off voltage applied to gate region 14 in the OFF state, causes a vertical electric field from source region 10b to gate region 14. This electric field excites carriers caught in the depletion region formed between source region 10b and channel region 10a. If the predetermined voltage larger than the gate voltage is instead applied to the drain region 10(c), the same leakage current losses will appear between the drain region 10(c) and the channel region 10(a). Therefore, the carriers accepting excitation energy due to the electric field become detached from the depletion region, and, as a result, a large leakage current is generated between the source and drain regions.

Figure 2:
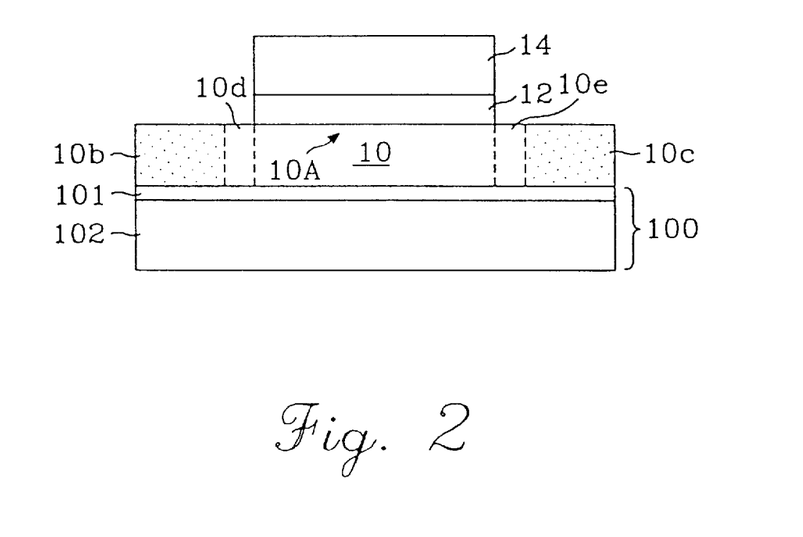
FIG. 2 is a cross-sectional view of a TFT having a conventional offset gated structure.

In order to improve the of leakage current problem produced during the OFF operation of the non-offset TFT of FIG. 1, another conventional TFT structure, shown in FIG. 2, has been developed. FIG. 2 illustrates a cross-sectional view of a TFT having a conventional offset gate structure, in which the undoped portion of active layer 10 is longer than gate region 14 to cause the source region 10b and drain region 10c to become offset from the gate electrode by a predetermined gap. Like regions are designated like reference numerals in FIGS. 1 and 2. In FIG. 2, however, offset regions 10d and 10e are formed in order to reduce the leakage current generated during OFF state. The offset resistance produced by offset regions 10d and 10e weakens the vertical electric field during the OFF state. Thus, the offset gate structure of FIG. 2 reduces the leakage current flowing between the source and drain regions due to the offset resistance.

In the TFT having the offset gate structure of FIG. 2, the offset regions become part of the channel region 10A, which decreases the gate driving capability of the ON current during an ON state, as compared with the TFT having a non-offset gate structure. In other words, due to the extra serial resistance, or offset resistance, produced by offset regions 10d and 10e, the turn-on current is reduced as compared with the TFT having the non-offset gate structure.

A variety of structures other than those illustrated in FIGS. 1 and 2 have been proposed to limit leakage current. However, these other TFT structures require additional manufacturing processes, and though the leakage current is somewhat reduced, the ON current is generally reduced as well due to the extra serial resistance produced by the offset region. Accordingly, a TFT having characteristics of an offset gate structure in the OFF state and a non-offset structure in the ON state would be desirable.

SUMMARY OF THE INVENTION

Therefore, it is an object of the present invention to provide a TFT which effectively reduces leakage current in its off state, without additional fabrication process steps and a method for making the same.

It is another object of the present invention to provide a polysilicon TFT which presents an offset gated structure in the OFF state, and a non-offset structure in the ON state and a method for making the same.

It is still another object of the present invention to provide a polysilicon TFT which reduces leakage current in the OFF state, as compared with the leakage current of a similar transistor having an offset gate structure, without reducing the ON current in the ON state below the ON current of a similar transistor having a non-offset gate structure.

It is yet another object of the present invention to provide a polysilicon TFT having a non-offset gate structure in which the offset region operatively disappears to allow for increased gate driving capability during turn ON, and is operatively formed to interrupt leakage current only during turn OFF and a method for making the same.

It is a further object of the present invention to provide method of making a TFT its which is compatible with the fabrication process of a polysilicon TFT of a typical non-offset gate structure, and has an improved operation characteristic without using an additional mask.

To accomplish the objects of the present invention, among others, the present invention provides a thin-film transistor that has a channel region operatively having an offset region only during turn-off. Source and drain regions self-aligned with different ends of the channel region. A gate region is formed on a gate insulating layer disposed over the channel region and has a main gate accepting a gate voltage, a subgate which comes into ohmic contact with the source region, and a junction gate for forming a rectifying junction between the main gate and subgate. It is desirable that the rectifying junction is a PNP type when the thin-film transistor is NMOS, while the rectifying junction is a NPN type when the thin-film transistor PMOS. The ohmic contact can be produced by connecting the source region to the subgate with a metal wire and the channel region is preferably made of polysilicon.

With the above structure, during operation the channel region is as long as the main gate and subgate during turn-on, whereas the channel region decreases the offset region that is produced only during turn-off that corresponds to the dimensions of the subgate. Accordingly, the polysilicon TFT of the present invention is constructed so that the offset region operatively disappears during turn-on to sufficient gate driving capability and is operatively formed only during turn-off to prevent leakage current.

The present invention also provides a method for fabricating a polysilicon-N-type thin-film transistor in which a gate insulating layer is formed on an active layer of a substrate. A gate region is formed on the gate insulating layer using a first photoresist pattern where a main gate and subgate will be placed. An N-type impurity is implanted into an exposed portion to form source and drain regions. After removing the first photoresist pattern, a second photoresist pattern is formed on a portion where the N-type impurity is implanted so that the main gate and subgate of the gate region can be formed by implanting P-type impurity into an exposed portion. The second photoresist pattern is then removed.

In addition, by connecting the source region to the subgate with metal after contact etching can guarantee the complete suppression of leakage current. The junction gate formed by implanting the first conductivity type ions is placed between the main gate and subgate formed by implanting the second conductivity type ions, to form a rectifying junction.

BRIEF DESCRIPTION OF THE DRAWINGS

The structure and fabrication of the preferred embodiment of transistor of the present invention will be described with reference to the attached drawings. In the drawings, regions or portions of the same structure and function are to be labeled with the same or similar reference numerals for easy understanding in which.

DETAILED DESCRIPTION OF THE PREFERRED EMBODIMENT

In the transistor of the present invention, amorphous silicon or polysilicon or both may be used as an active device portion material. The present invention may be applied to a general MOS transistor having a relatively short channel as well as to a thin-film transistor. According to the type of impurity ions implanted, an N-type or P-type transistor can be selectively formed. When the TFT is N-type, the first conductivity type ions are N-type impurity, while the second conductivity type is P-type impurity. If the TFT were P-type, the first and second conductivity types would be reversed. Further, the present invention may be applied to a CMOS structure in which N-type and P-type transistors are both formed on the same substrate.

Hereinafter, one embodiment of the present invention will be described with an example of an N-type TFT, with reference to the attached drawings.

Figure 3A:
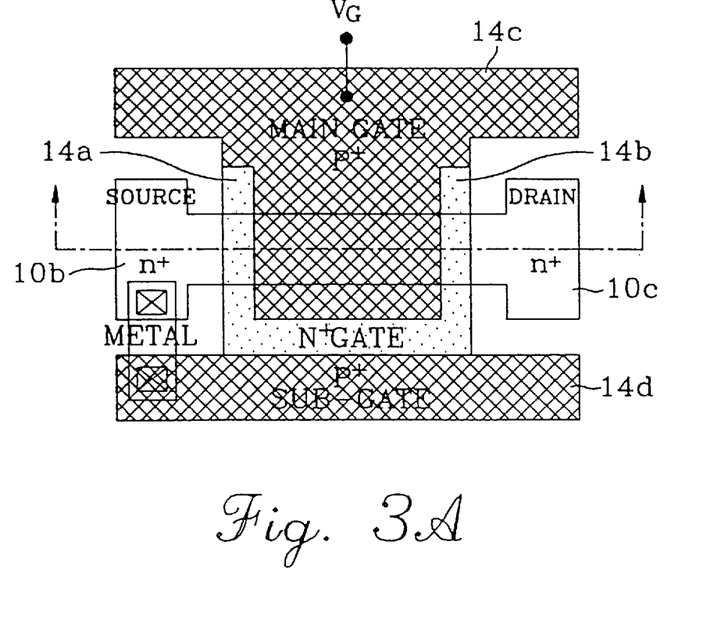
FIGS. 3A and 3B are plan and sectional views of one embodiment of TFT of the present invention, respectively.
Figure 10:
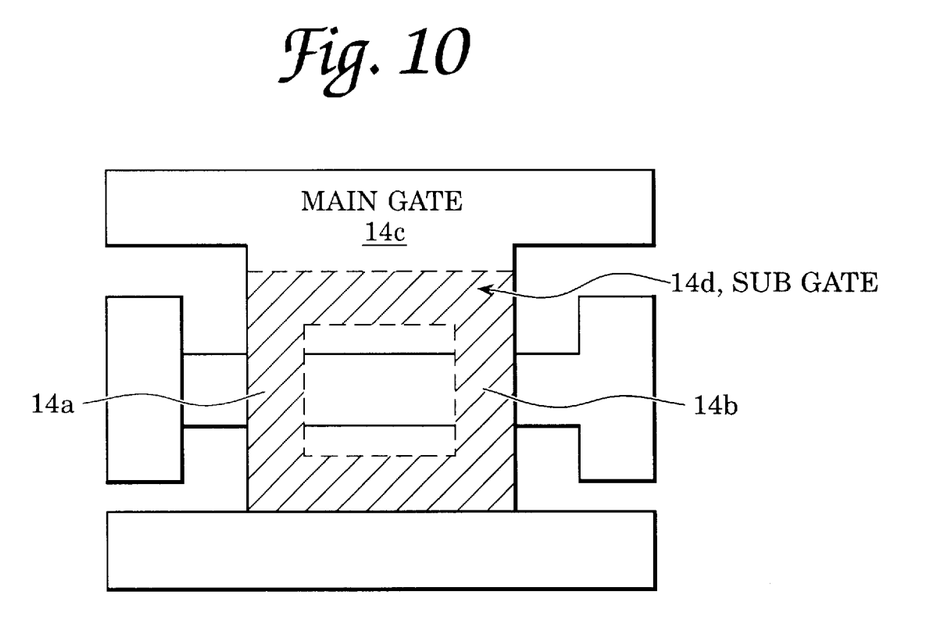
FIG. 10 illustrates a plan view of another embodiment of the present invention.

Referring to FIG. 3A, a main gate 14c, junction gates 14a and 14b and subgate 14d are formed over a gate insulating layer and on the same layer. Subgate 14d is rectangular two-dimensionally and junction gates 14a and 14b together being U-shaped two-dimensionally. The junction gates 14a and 14b together may also be formed at the perimeter of a square two-dimensionally by invading a portion of main gate 14c as illustrated in FIG. 10. Main gate 14c is T-shaped two-dimensionally. Through a metal wire, source region 10b comes into nonrectifying contact, that is, ohmic contact, with subgate 14d. The gate region formed on the gate insulating layer includes subgate 14d, main gate 14c, and junction gates 14a and 14b for forming a rectifying junction between main gate 14c and subgate 14d. Here, the rectifying junction appears as PNP junction in the sequence of main gate 14c, junction gates 14a and 14b and subgate 14d, because junction gates 14 and 14b are implanted with an N-type dopant. If the plan view structure of FIG. 3A is cut along line A—A the cross-section of FIG. 3B is obtained.

Figure 3B:
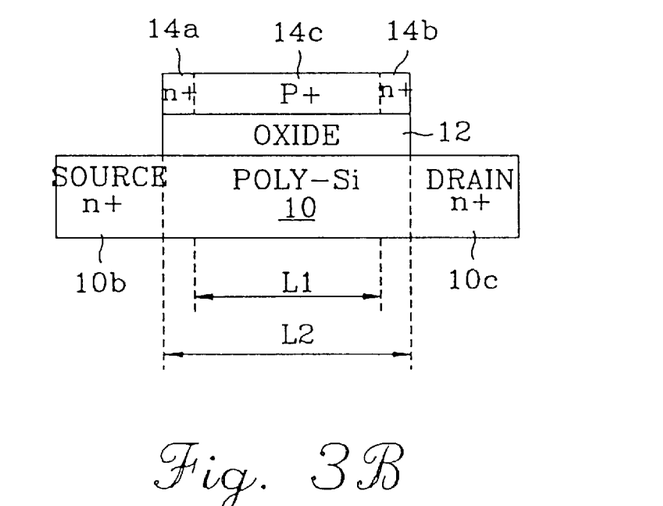

Referring to FIG. 3B, active layer 10 includes a channel region 10a that is formed below gate insulating layer 12, and source and drain regions 10b and 10c are formed on the left and right nearby portions of the channel region 10a, respectively.

Above gate insulating layer 12, main gate 14c and junction gates 14a and 14b are formed on the same layer. The length of the channel region 10a of active layer 10 is equal to the length (L2) of the gate region formed on gate insulating layer 12 during turn-on. The entire length of an offset region produced only during turn-off becomes the remainder of the length L2 of the gate insulating layer subtracted from the effective length L1 of the main gate. The length of the channel region in the OFF state becomes L1, while its length in the ON state becomes L2.

Operation of the transistor of the present invention will be described with reference to FIGS. 3A and 3B to clarify the structural description provided above. As shown in FIGS. 3A and 3B, the present invention has a gate region divided into three portions which form a PNP junction. An N+ doped portion (indicating junction gates 14a and 14b, and also called N+ gate for convenience) covers part of the left and right sides of the channel region placed adjacent the drain and source. Main gate 14c and subgate 14d are formed with a P+ doped region. A gate voltage is applied to main gate 14c, and subgate 14d is connected to source region 10b.

In a state where the source voltage is higher than the gate voltage, that is, in the turn-off state (Vs>Vg), the source voltage is applied to the N+ gate portion through forward-biased PN junction (between subgate 14d and junction gates 14a and 14b). In this case, the source voltage is isolated from main gate 14c. This is because a reverse-biased PN junction is essentially formed between the N+ gate and P+ doped main gate. In other words, if resistivity is smaller in one direction in the rectifying junction, the resistivity becomes extremely large in the reverse direction. When the gate voltage is fully reduced and the transistor is completely turned off, the N+ gate region receives almost the same voltage as source voltage Vs, but the vertical electric field is sharply reduced between the drain or source region and the gate due to the reverse-biased PN junction. Therefore, the carriers cannot receive sufficient excitation energy, and the leakage current is almost cutoff. In the transistor of FIGS. 3A and 3B, the offset region is formed operatively to interrupt the leakage current only during turn-off. The offset region divided into two parts 10d and 10e, as shown in FIG. 4B is formed in active region 10 as long as the N+ gate only during OFF operation in FIGS. 3A and 3B. The entire length of the offset region becomes the remainder of the length L2 of gate insulating layer subtracted from the effective length L1 of the main gate.

In the turn-on state, when the gate voltage is higher than the source voltage, the gate voltage is applied to the N+ gate through the forward-biased PN junction without change. For this reason, the offset region disappears. The gate voltage is isolated from subgate 14d by the reverse-biased PN junction. The N+ gate voltage becomes the same as that of the main gate so that the transistor of the present invention operates as a device having a non-offset structure in its ON state.

Figure 4A:
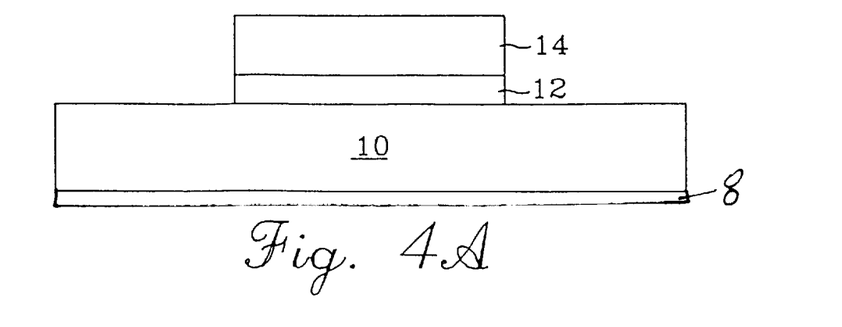
FIGS. 4A, 4B and 4C show the process sequence of fabricating the TFT shown in FIGS. 3A and 3B.
Figure 4B:
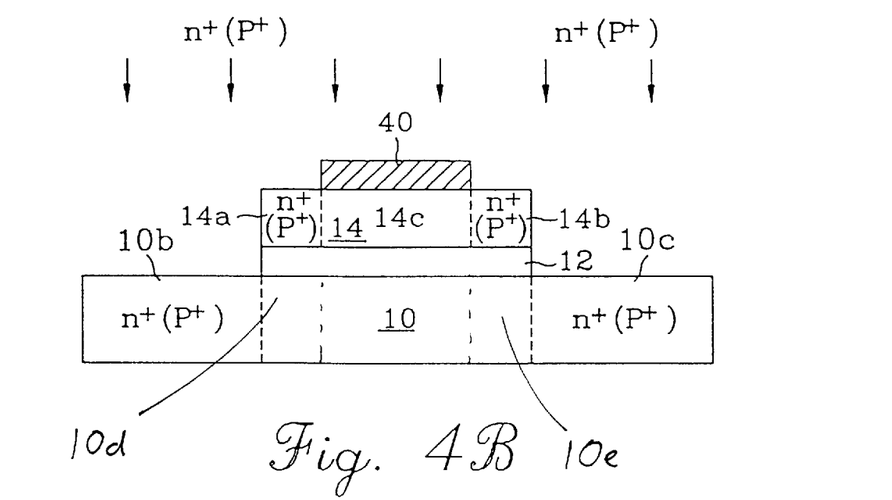
Figure 4C:
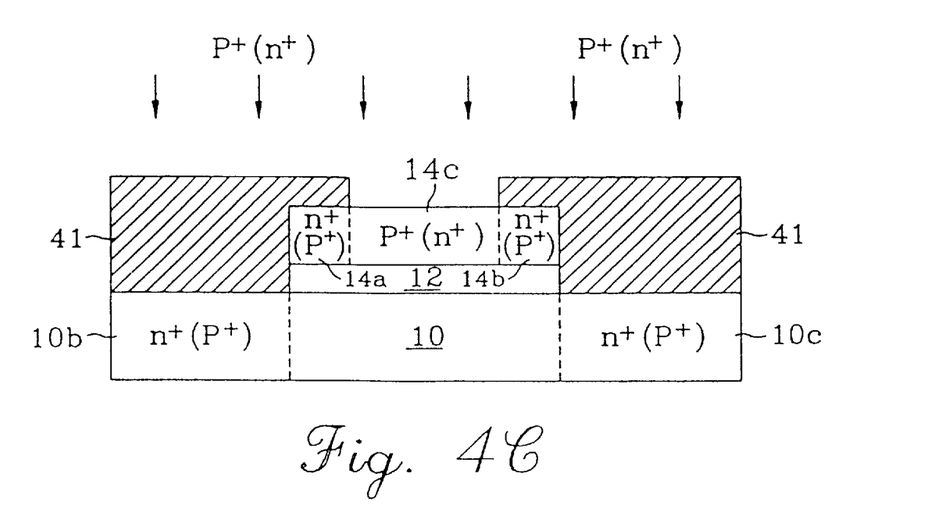

Referring to FIGS. 4A, 4B and 4C, there is shown an example where a non-offset TFT having the N+ gate of 2μm is fabricated with a polysilicon thin film, using a low-temperature process. It should be understood in the following description that the process of fabricating the transistor may be the same as that of a non-offset device, excluding N+ and P+ implantation photographic processes.

Referring to FIG. 4A, gate insulating layer 12 is formed on active layer 10 above a substrate 8 having a grown oxide layer. Gate region 14 is formed on gate insulating layer 12. Though not shown in FIG. 4A, a substrate 100 is placed under active layer 10, as shown in FIG. 1. Substrate 100 is preferably made up of a silicon wafer layer 102 of amorphous, single or poly crystals, and a thermal oxide layer 101 thermally grown above wafer layer 102. In this embodiment, a silicon wafer having a thermally grown oxide layer of 5,000 Å is used as a starting substrate, and a non-doped amorphous silicon layer of 1,000 Å is coated on the substrate by LPCVD at 550° C., to form active layer 10. While the film is annealed at 600° C., active layer 10, that is, amorphous silicon layer 10, is crystallized and then converted into polysilicon. After this step, gate insulating layer 12 and gate region 14 are sequentially coated and patterned, each having a thickness of 1,000 Å. The material of gate region 14 is polysilicon. According to this process, the structure shown in FIG. 4A is obtained. It is noted that the processing sequence of FIG. 4A prior to the patterning of gate is the same as that of the conventional non-offset device.

Figure 5A:
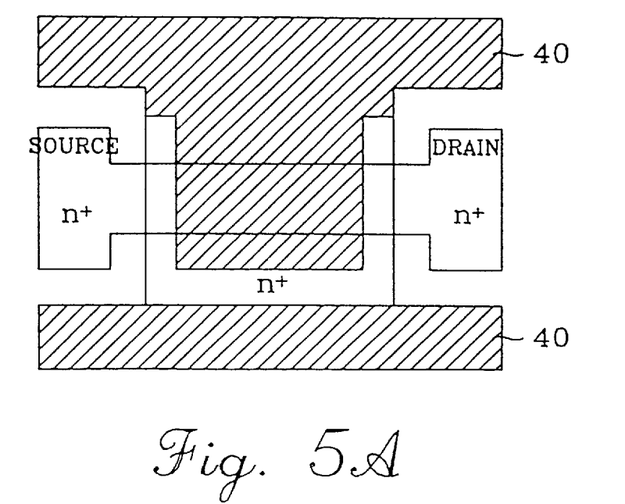
FIGS. 5A and 5B show the forms of photoresist patterns related to FIGS. 4A, 4B and 4C.

Referring to FIG. 4B, in order to form junction gates 14a and 14b, source region 10b and drain region 10c, a photoresist pattern 40 is formed on a portion where main gate 14c and subgate 14d are to be placed. N-type ions are implanted heavily into an exposed portion excluding the formed pattern. When fabricating a P-type TFT, P-type ions will be implanted heavily. The whole plan shape of photoresist pattern 40 is shown in FIG. 5A. The hatched portion of FIG. 5A covers main gate 14c and subgate 14d in FIG. 3A. After the implantation of the N-type ions, photoresist pattern 40 is removed. Therefore, after the completion of the process shown in FIG. 4B, junction gates 14a and 14b, source region 10b and drain region 10c are finished. Here, source region 10b and drain region 10c are self-aligned due to the length of gate region 14.

Figure 5B:
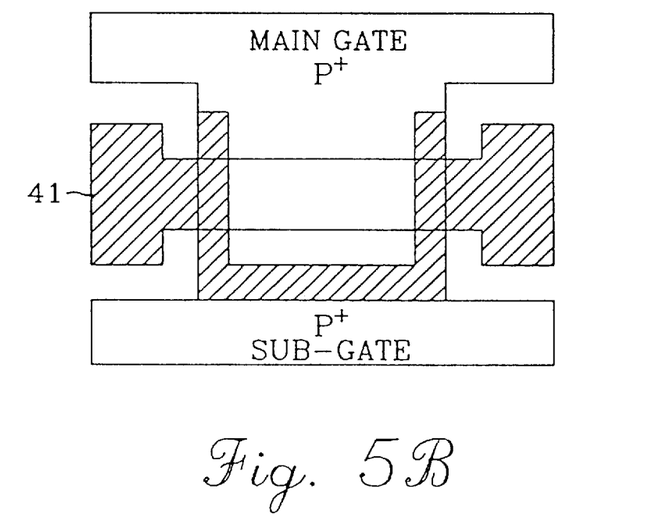

Referring to FIG. 4C, in order to form main gate 14c and subgate 14d, a photoresist pattern 41 is formed on a portion where the N+ ions are implanted, and then P-type ions are implanted heavily into an exposed portion excluding the formed photoresist pattern 41. When fabricating a P-type TFT, N-type ions will be implanted heavily. The whole plan shape of photoresist pattern 41 is shown in FIG. 5B. The hatched portion of FIG. 5B covers junction gates 14a and 14b, source region 10b and drain region 10c in FIGS. 3A and 3B. After the implantation of P-type ions, photoresist pattern 41 is removed. When the processing of FIG. 4C is completed, main gate 14c and subgate 14d are completely formed.

After the process of FIG. 4C, in order to protect the respective portions exposed, an insulating oxide layer is coated by dopant activation and then annealed for 20 hours at 600° C. Contact etching may then be performed, and aluminum electrodes formed. These steps are similar to the processing steps of a conventional TFT. In this embodiment, source region 10b is connected to the subgate in order to completely interrupt leakage current when the electrode are formed. In order to implant the first and second conductivity type ions, the respective steps of forming the first and second resist patterns may be replaced with photomasking steps.

The TFT of FIGS. 3A and 3B manufactured according to the manufacturing process of FIGS. 4A, 4B and 4C has the non-offset gated structure during turn-on. The offset region is operatively formed to interrupt leakage current only during turn-off.

Characteristics of the transistor manufactured according to the embodiment of the present invention will be described in association with FIGS. 6, 7, 8 and 9.

Figure 6:
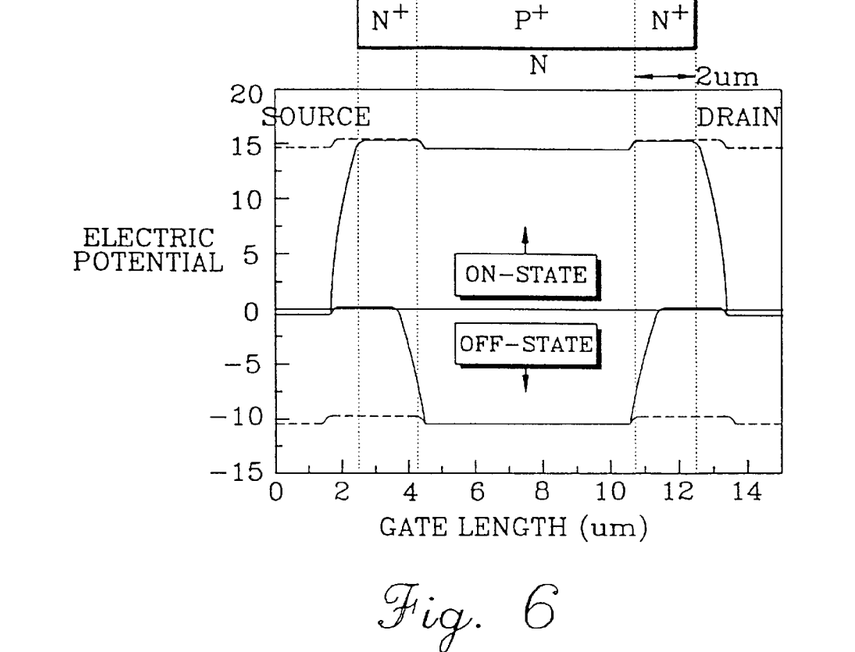
FIGS. 6, 7, 8 and 9 show graphs of various characteristics of the TFT of the present invention.

FIG. 6 is a graph showing the result of simulation of particle distribution within the gate region in the ON or OFF state. In FIG. 6, the upper graph shows the ON state, the lower graph showing the OFF state. In the simulation result of FIG. 6, the gate voltage is completely applied to the N+ gate (junction gate) in the ON state, and only to the main gate in the OFF state. As a result, the N+ gate region reduces the length of the gate region so that the corresponding channel region operates as the offset region in the OFF state.

Figure 7:
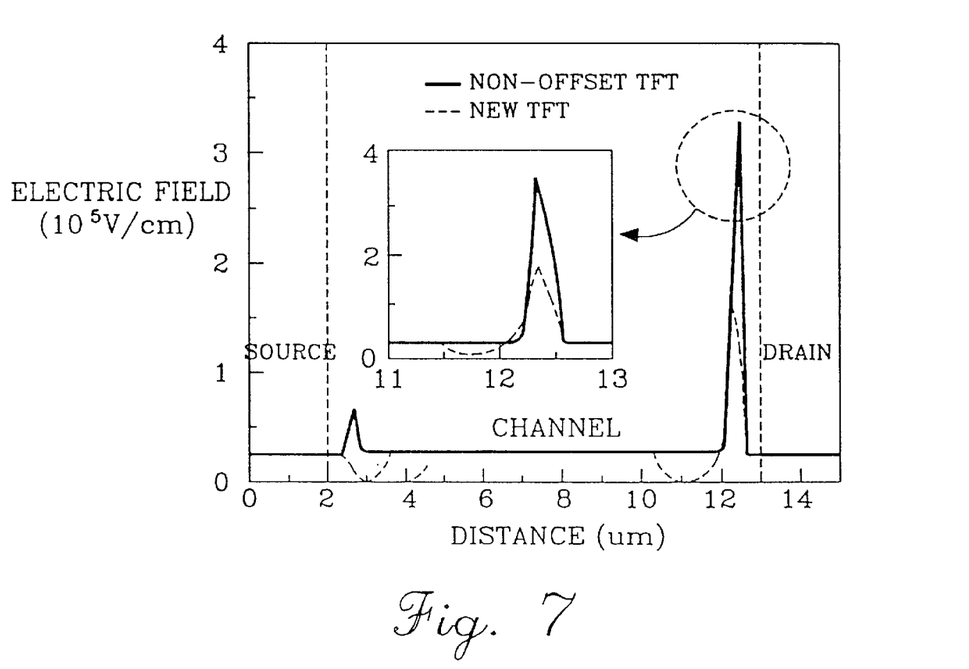

It is shown in FIG. 7 that the electric field in the maximum offset state is about half the conventional non-offset device in the TFT of the present invention. Thus, the leakage current of the device becomes far smaller than that of the conventional non-offset device. In FIG. 7, the graph shown in full line indicates the characteristics of the conventional non-offset device. The graph shown in dotted line indicates the characteristics of the transistor device of the present invention.

Figure 8:
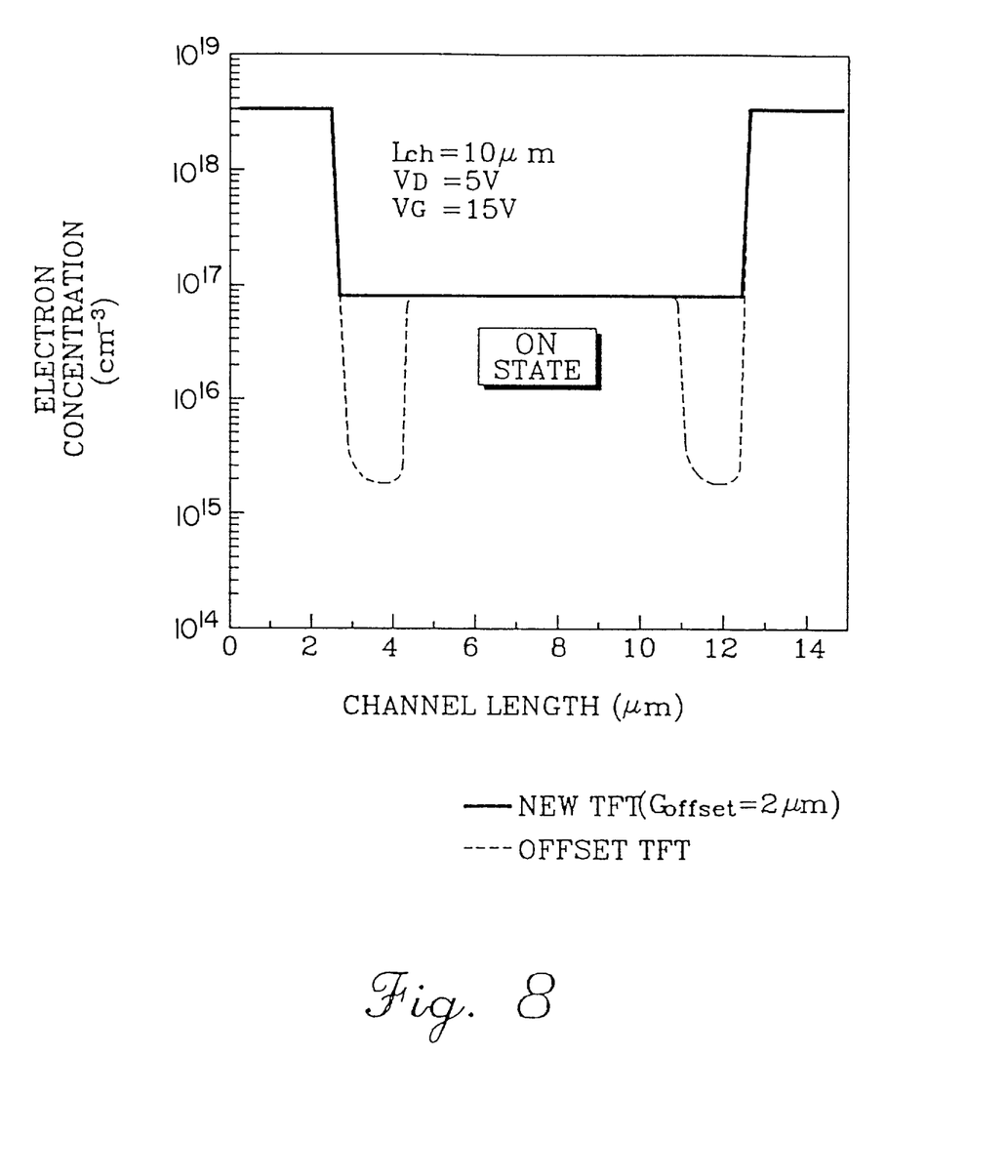

Referring to FIG. 8, there is shown a graph of channel length to electron concentration, indicating the current characteristic during turn-on. While the transistor device of the present invention is turned on, the electron concentration around the channel—about 100 times that of the conventional offset device is almost the same as the conventional non-offset device. Accordingly, the ON current becomes almost the same as that of the conventional non-offset device.

Figure 9:
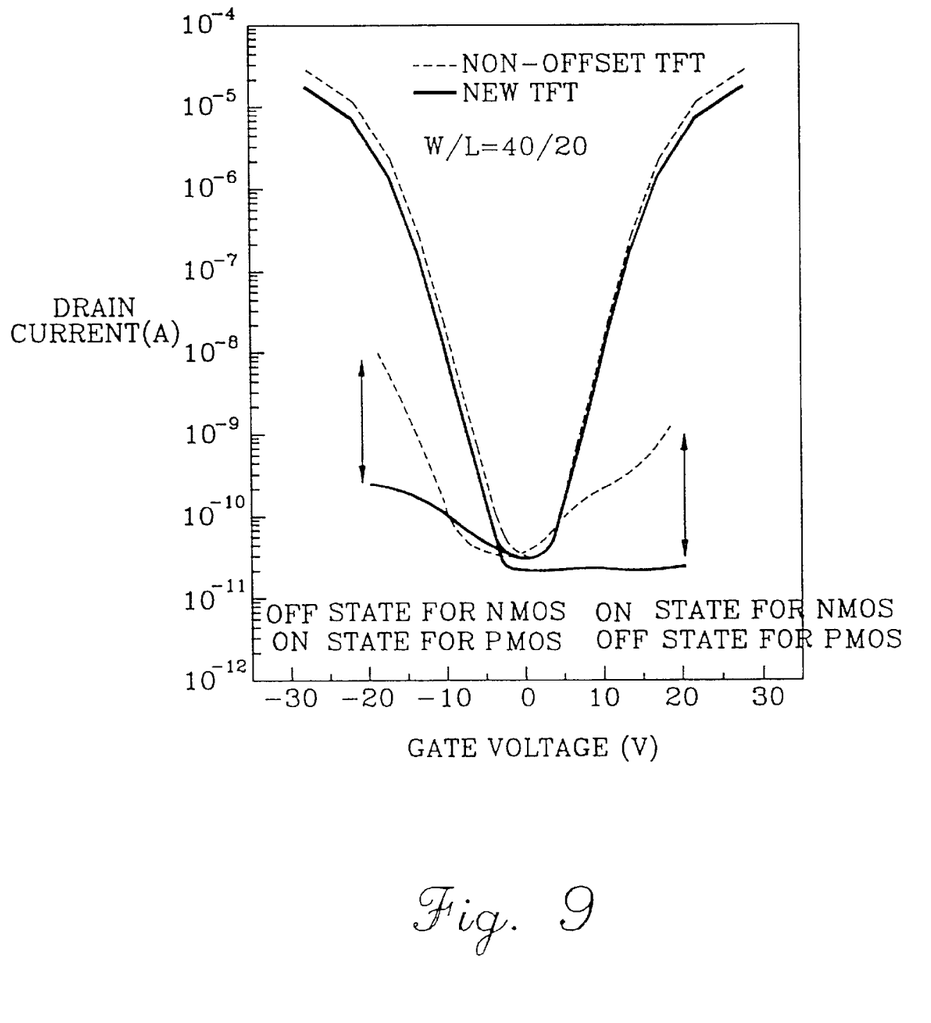

As shown in FIG. 9, the drain current, which represents the ON current of the device of the present invention, is almost the same as that of the non-offset device. However, during turn-on, the leakage current of the N-type MOS transistor of the present invention is increased far less than that of the conventional non-offset N-type MOS device. The leakage current of the present invention is 100 times less than that of the non-offset device with a 20 V gate voltage. Also, the leakage current of the P-type MOS transistor device of the present invention does not increase throughout the range of gate voltages. In the P-type MOS device of the present invention, a small drain voltage (about 5 V) does not result in an increased leakage current due to its hole mobility. Therefore, in terms of ON/OFF current ratio, the device of the present invention is remarkably increased 100 times the conventional current ratio.

As described above, the present invention provides a novel polysilicon TFT which exhibits an offset gated structure in the OFF state and operates with a non-offset structure in the ON state. The manufacturing process of such polysilicon TFT is compatible with that of the typical non-offset polysilicon TFT. Since different patterns or masks are required, manufacturing cost is reduced. Further, in the polysilicon TFT of the present invention having the PN junction gate, its ON current is almost the same as the conventional ON current but the leakage current is substantially reduced from the conventional leakage current, thus improving the ON/OFF current ratio characteristic.

Though the preferred embodiment of the present invention has been described, various change and modifications are within the scope of the present invention. For instance, amorphous or polysilicon or both may be used for the active device portion material. Also, the shape of gate region, the length of channel region, and the sequence of manufacturing process may be modified.

Therefore, it should be understood that the present invention is not limited to the particular embodiment disclosed and those skilled in the art will appreciate that many modifications are possible in the exemplary embodiment without departing from the novel teachings and advantages of this invention. Accordingly, all such modifications are intended to be included within the scope of this invention as defined in the following claims.

What is claimed is:

1. A thin-film transistor comprising:
   a channel region having an offset region in first and second portions of said channel region only during turn-off;
   a gate insulating layer formed on said channel region;
   a source region self-aligned with said channel region and formed adjacent said first portion of said channel region;
   a drain region self-aligned with said channel region and formed adjacent said second portion of said channel region; and
   a gate region formed on said gate insulating layer having a main gate, a subgate that is in ohmic contact with said source region, and a junction gate so that a rectifying junction is formed between said main gate and said subgate.

2. A thin-film transistor as claimed in claim 1, wherein said rectifying junction is a PNP junction and said thin-film transistor is an NMOS transistor.

3. A thin-film transistor as claimed in claim 1, wherein said rectifying junction is an NPN junction and said thin-film transistor is a PMOS transistor.

4. A thin-film transistor as claimed in claim 1, wherein said ohmic contact is produced by connecting said source region to said subgate with a metal wire.

5. A thin-film transistor as claimed in claim 1, wherein said channel region is made of polysilicon formed by annealing amorphous silicon at a predetermined temperature.

6. A thin-film transistor as claimed in claim 1, wherein said channel region is made of polysilicon formed by annealing amorphous silicon coated on a substrate having a grown oxide layer at a predetermined temperature.

7. A thin-film transistor as claimed in claim 1, wherein said channel region is as long as the gate region during turn-on.

8. A thin-film transistor as claimed in claim 1, wherein said junction gate has first and second portions disposed above said first and second portions of said channel region, and an offset region length during turn-off corresponds to a length of said first and second portions of said junction gate.

9. A thin-film transistor as claimed in claim 1, wherein said main gate and said subgate have the same conductivity type.

10. A thin-film transistor as claimed in claim 1, wherein said channel region is made of amorphous silicon.

11. A thin-film transistor as claimed in claim 1, wherein the conductivity type of said junction gate is the same as that of said source region.

12. A thin-film transistor as claimed in claim 1, wherein the conductivity type of said junction gate is the same as that of said drain region.

13. A thin-film transistor as claimed in claim 8, wherein said main gate is isolated from said subgate by said first and second portions of said junction gate.

14. A thin-film transistor as claimed in claim 13, wherein said main gate, junction gate, and subgate are formed as the same layer on said gate insulating layer.

15. A thin-film transistor as claimed in claim 14, wherein said subgate is rectangular from a top view.

16. A thin-film transistor as claimed in claim 15, wherein said junction gate is U-shaped from a top view.

17. A thin-film transistor as claimed in claim 15, wherein said junction gate is formed at a perimeter of a square from a top view.

18. A thin-film transistor as claimed in claim 15, wherein said main gate is formed to be T-shaped from a top view.

19. A thin-film transistor as claimed in claim 18, wherein said junction gate is formed by heavily implanting N-type ions.

20. A thin-film transistor as claimed in claim 18, wherein said junction gate is formed by heavily implanting P-type ions.

21. An N-type thin-film transistor comprising:

a channel region having an offset region in first and second portions of said channel region only during turn-off;

a gate insulating layer formed on said channel region;

an N-type source region formed adjacent said first portion of said channel region;

an N-type drain region formed adjacent said second portion of said channel region; and a PNP gate region formed on said gate insulating layer having a P-type main gate, a P-type subgate that is in ohmic contact with said source region, and an N-type junction gate so that a rectifying junction is formed between said main gate and said subgate.

22. An N-type thin film transistor according to claim 21, wherein said channel region is one of polysilicon and amorphous silicon.

23. A P-type thin-film transistor comprising:

a channel region having an offset region in first and second portions of said channel region only during turn-off;

a gate insulating layer formed on said channel region;

a P-type source region formed adjacent said first portion of said channel region;

a P-type drain region formed adjacent said second portion of said channel region; and an NPN gate region formed on said gate insulating layer having an N-type main gate, an N-type subgate that is in ohmic contact with said drain region, and a P-type junction gate so that a rectifying junction is formed between said main gate and said subgate.

24. A P-type thin film transistor according to claim 23, wherein said channel region is one of polysilicon and amorphous silicon.

25. A MOS transistor comprising:

a relatively short channel region having an offset region in first and second portions of said channel region only during turn-off;

a gate insulating layer formed on said channel region;

a source region self-aligned with said channel region and formed adjacent said first portion of said channel region;

a drain region self-aligned with said channel region and formed adjacent said second portion of said channel region; and a gate region formed on said gate insulating layer having a main gate, a subgate that is in ohmic contact with said source region, and a junction gate so that a rectifying junction is formed between said main gate and said subgate.

26. A MOS transistor as claimed in claim 25, wherein said rectifying junction is a PNP junction and said MOS transistor is an NMOS transistor.

27. A MOS transistor as claimed in claim 25, wherein said rectifying junction is an NPN junction and said MOS transistor is a PMOS transistor.

28. A MOS transistor as claimed in claim 25, wherein said ohmic contact is produced by connecting said source region to said subgate with a metal wire.

29. A MOS transistor as claimed in claim 25, wherein said channel region is as long as the gate region during turn-on.

30. A MOS transistor as claimed in claim 25, wherein said junction gate has first and second portions disposed above said first and second portions of said channel region, and an offset region length during turn-off corresponds to a length of said first and second portions of said junction gate.

31. A MOS transistor as claimed in claim 25, wherein said main gate and said subgate have the same conductivity type.

* * * * *